US006973633B2

(12) United States Patent
Lippincott et al.

(10) Patent No.: US 6,973,633 B2
(45) Date of Patent: Dec. 6, 2005

(54) CACHING OF LITHOGRAPHY AND ETCH SIMULATION RESULTS

(76) Inventors: George Lippincott, 16711 Gary La., Lake Oswego, OR (US) 97034; Nick Cobb, 1682 Willow Lake La., San Jose, CA (US) 95131; Robert Todd, 21905 SW. 109th Ter., Tualatin, OR (US) 97062

( * ) Notice: Subject to any disclaimer, the term of this patent is extended or adjusted under 35 U.S.C. 154(b) by 28 days.

(21) Appl. No.: 10/206,691

(22) Filed: Jul. 24, 2002

(65) Prior Publication Data

US 2004/0019872 A1    Jan. 29, 2004

(51) Int. Cl.[7] ............................................. G06F 17/50
(52) U.S. Cl. ................. 716/11; 716/2; 716/19
(58) Field of Search ............................. 703/14; 716/2, 716/11, 19, 20, 21; 702/81; 257/48

(56) References Cited

U.S. PATENT DOCUMENTS

| | | |
|---|---|---|
| 4,762,396 A | 8/1988 | Dumant et al. |
| 5,502,654 A | 3/1996 | Sawahata |
| 5,655,110 A | 8/1997 | Krivokapic et al. |
| 5,723,233 A | 3/1998 | Garza et al. |
| 5,825,647 A | 10/1998 | Tsudaka |
| 5,879,844 A | 3/1999 | Yamamoto et al. |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,370,679 B1 | 4/2002 | Chang et al. |
| 6,425,117 B1 | 7/2002 | Pasch et al. |
| 6,453,452 B1 | 9/2002 | Chang et al. |
| 6,453,457 B1 | 9/2002 | Pierrat et al. |
| 6,467,076 B1 | 10/2002 | Cobb |
| 6,499,003 B2 | 12/2002 | Jones et al. |
| 6,591,207 B2 * | 7/2003 | Naya et al. .................... 702/81 |
| 2002/0113234 A1 * | 8/2002 | Okuda et al. ................. 257/48 |

FOREIGN PATENT DOCUMENTS

JP          09319067 A      12/1997
WO       WO 01/65315 A2    9/2001

OTHER PUBLICATIONS

Cobb, N., et al., "Fast, Low-Complexity Mask Design," Department of Electrical Engineering and Computer Science University of California at Berkeley, 15 pages.

(Continued)

*Primary Examiner*—Thuan Do
(74) *Attorney, Agent, or Firm*—Christensen O'Connor Johnson Kindness PLLC (57) ABSTRACT

One or more control points are identified within a reticle layout that is used in a simulation of a manufacturing process for an integrated device layer. Further, a current geometrical layout pattern is determined in the vicinity of the control points, and a cache is searched for a matching geometrical layout pattern. If the search is successful, a simulation result associated with the matching geometrical layout pattern is retrieved from the cache and reused for the current geometrical layout pattern. Alternatively, if the search is unsuccessful, a simulation result associated with the current geometrical design pattern is computed and stored in the cache for future reuse.

15 Claims, 6 Drawing Sheets

OTHER PUBLICATIONS

Cobb, N., et al., "Fast Sparse Aerial Image Calculation For OPC," Department of Electrical Engineering and Computer Science University of California at Berkeley, 12 pages.

Cobb, N., et al., "Mathematical and CAD Framework For Proximity Correction," Department of Electrical Engineering and Computer Science University of California at Berkeley, 15 pages.

Future Fab International, "Technology Tradeoffs for OPC and PSM," Lithography: Equipment & Materials, pp. 165-171.

Schellenberg, F. M., "Adoption of OPC and the Impact on Design and Layout," DAC 2001, Jun. 18-22, 2001, Las Vegas, Nevada, pp. 89-92.

Cobb, N., and Y. Granik, "Model-Based OPU Using the MEEF Matrix," *Proceedings of SPIE*, vol. 4889: *22nd Annual BACUS Symposium on Photomask Technology*, Monterey, Calif., Sep. 30-Oct. 4, 2002, p. 147.

Cobb, N., and A. Zakhor, "Experimental Results on Optical Proximity Correction With Variable Threshold Resist Model," *Proceedings of SPIE*, vol. 3051: *Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE*, vol. 2440: *Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE*, vol. 2621: *15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE*, vol. 2197: *Symposium on Optical/Laser Microlithography VII*, San Jose, Calif., Mar. 2-4, 1994, pp. 348-360.

Cobb., N., et al., "Mathematical and CAD Framework for Proximity Correction,"0 *Proceedings of SPIE*, vol. 2726: *Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE*, vol. 5130: *Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE*, vol. 4562: *21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE*, vol. 4754; *Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool ," *Proceedings of SPIE*, vol. 3334: *Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE*, vol 2884: *16th Annual Symposuim on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics* 37(12B):6686-6688, Dec. 1998.

* cited by examiner

SIMULATION RESULT LOOKUP TABLE 400

| GEOMETRY DATA | CONTROL POINT INTENSITY VALUES | CUMULATIVE INTENSITY VALUE | EPE |
|---|---|---|---|
| $\begin{bmatrix} X_1, Y_1, X_2, Y_2 \\ \vdots \ \vdots \ \vdots \ \vdots \end{bmatrix}$ | $I_1 \ \ldots \ I_N$ | $I_{sum}$ | epe |
|  |  |  |  |

CACHING OF LITHOGRAPHY AND ETCH SIMULATION RESULTS

FIELD OF THE INVENTION

The invention relates to integrated device design. More particularly, the invention relates to caching of lithography and etch simulation results during optical and process correction (OPC).

BACKGROUND OF THE INVENTION

As integrated circuits (ICs) become denser, the widths of lines and components, as well as the separation between lines becomes increasingly smaller. Currently, deep sub-micron (<0.25 μm) processes are being used. However, with deep sub-micron processes, silicon yield is affected by several factors including reticle/mask pattern fidelity, optical proximity effects, and diffusion and loading effects during resist and etch processing. Typical problems include linewidth variations that depend on local pattern density and topology and line end pullback.

Optical and process correction (OPC) can be used to improve image fidelity. Optical proximity correction is a subset of optical and process correction. OPC techniques include, for example, introduction of systematic changes to the geometry of an IC reticle layout to compensate for nonlinear distortions introduced by optical diffraction and resist effects.

Two general categories of OPC are currently in use: rule-based OPC and model-based OPC. In rule-based OPC, a reticle layout is modified according to a set of fixed rules for geometric manipulation. However, rule-based OPC has limited capability and when more complex OPC is desired, model-based OPC is used.

Under model-based OPC, corrections to a reticle layout are calculated through computer simulations employing various models such as optical models. Model-based OPC can be very computationally intensive. Typically, for every edge in the reticle layout, an edge placement error is determined by simulation. Edge placement error identifies the deviation of the edge in a simulated layout (or actual layout) from the corresponding edge in the target layout. Based on an edge placement error, an edge may be pushed or pulled in an attempt to compensate for the error. The simulations and adjustments may need to be repeated (iterated) several times for each edge before the edge placement error is within acceptable limits.

The accuracy of the edge placement error can be increased if computations are done for fragments of edges. Fragmenting involves inserting additional vertices to create smaller sections of edges, or edge fragments. The granularity of the fragments defines the fineness of the OPC corrections that can be made. Fragmentation rules generally define where vertices should be added. The greater the number of vertices added, the more precise edge placement corrections can be made at the expense of increased OPC computations. In other words, increasing the granularity of edge fragments increases potential OPC accuracy but decreases speed.

Some existing OPC techniques attempt to reduce computational costs associated with model-based OPC by reusing OPC results for matching portions of reticle layouts. That is, the corrected state of a reticle layout portion is determined and stored with the initial state of the reticle layout portion in a database. Subsequently, when a reticle layout portion with a matching geometry is encountered, the OPC result is reused to avoid the necessity of having to re-perform the simulations. However, this reuse mechanism has proved to reduce OPC accuracy because it uses the results that are based solely on the matching geometry and fails to take into account other factors that contribute to computations performed during each iteration.

Thus, what is needed is an improved reuse mechanism that reduces computational costs associated with OPC without negatively affecting the accuracy of OPC.

SUMMARY OF THE INVENTION

The present invention relates to performing optical and process correction (OPC) on a reticle layout using previously calculated simulation results. According to one aspect of the present invention, one or more control points are identified within a reticle layout that is used in a simulation of a manufacturing process for an integrated device layer. Further, a current geometrical layout pattern is determined in the vicinity of the control points, and a cache is searched for a matching geometrical layout pattern. If the search is successful, a simulation result associated with the matching geometrical layout pattern is retrieved from the cache and reused for the current geometrical layout pattern. Alternatively, if the search is unsuccessful, a simulation result associated with the current geometrical design pattern is computed and stored in the cache for future reuse.

BRIEF DESCRIPTION OF THE DRAWINGS

The invention is illustrated by way of example, and not by way of limitation in the figures of the accompanying drawings in which like reference numerals refer to similar elements.

DETAILED DESCRIPTION

Methods and apparatuses for performing optical and process correction (OPC) on a reticle layout using previously calculated simulation results are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses are described herein with respect to integrated circuit manufacturing; however, the techniques described can be applied to the manufacturing and/or design process of any integrated device. Integrated devices include integrated circuits, micromachines, thin film structures such as disk drive heads, gene chips, microelectromechanical systems (MEMS), or any other article of manufacture that is manufactured using lithography techniques.

Parts of the description will be presented using terminology commonly employed by those skilled in the art to convey the substance of their work to others skilled in the art, such as reticle/mask layouts, geometries, model-based simulations and so forth. Also, parts of the description will also be presented in terms of operations performed by a computer system, using terms such as determining, generating and so forth. As well understood by those skilled in the art, these operations and quantities operated on, take the form of electrical, magnetic, or optical signals capable of being stored, transferred, combined, and otherwise manipulated through electrical/optical components of a digital system; and the term digital system includes general purpose as well as special purpose data processing machines, systems, and the like, that are standalone, adjunct or embedded.

Various operations will be described as multiple discrete steps performed in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

The present invention relates to performing optical and process correction (OPC) on a reticle layout using previously calculated simulation results. The simulation results may include various values that are computed when iteratively employing model-based simulations. These values may include edge placement errors, intensity values and other lithography and etch simulation results associated with different geometrical layout patterns of the reticle layout. Once a simulation result is computed for a certain geometrical layout pattern of the reticle layout, it is saved in a cache. Subsequently, when a matching geometrical layout pattern is encountered, the simulation result saved in the cache is reused, thus avoiding the necessity of having to repeat the expensive computation for the matching geometrical layout pattern.

Figure 1:
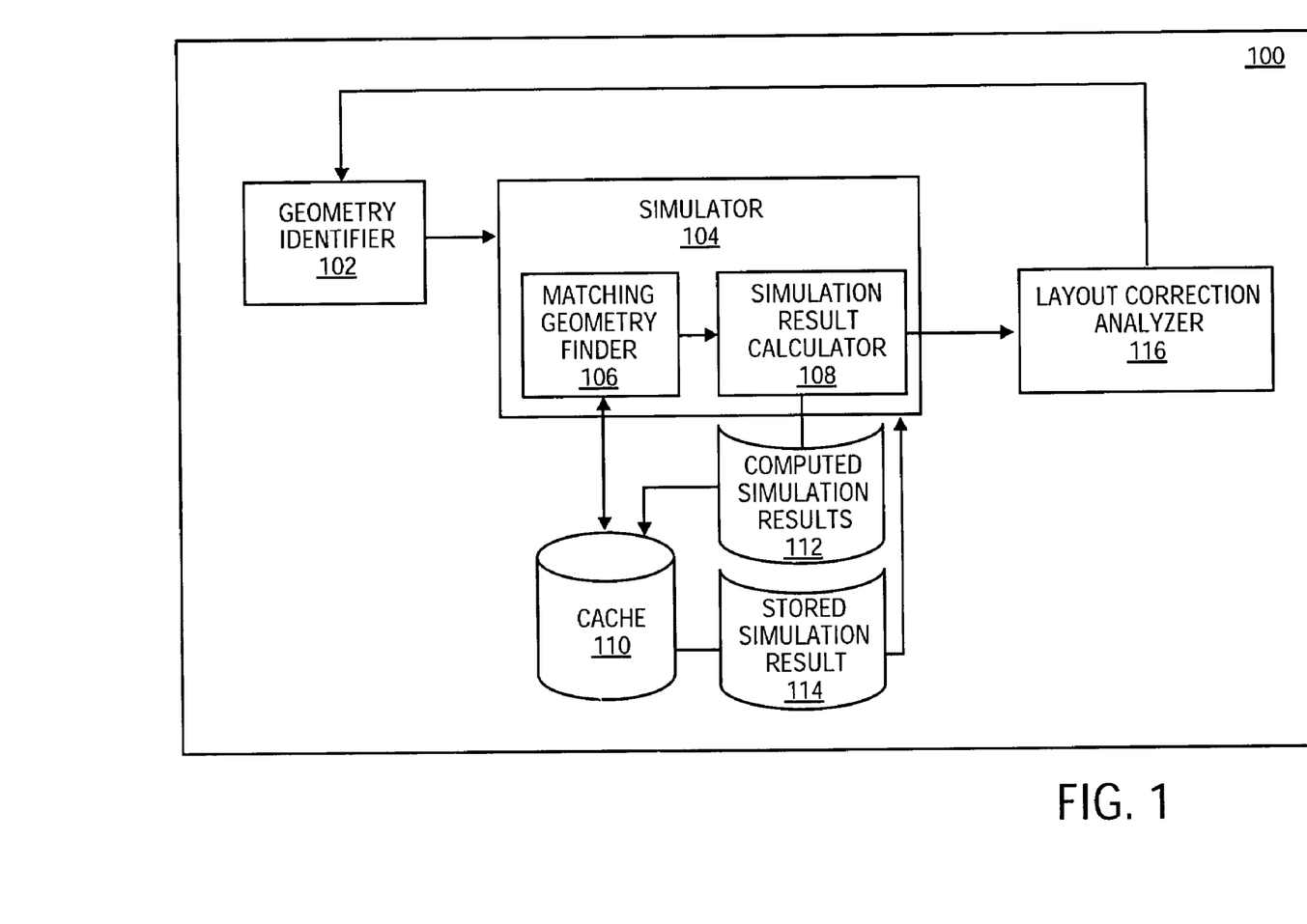
FIG. 1 is a block diagram of one embodiment of an OPC module that utilizes previously calculated simulation results.

FIG. 1 is a block diagram of one embodiment of an OPC module 100 that utilizes previously calculated simulation results. OPC module 100 receives an input reticle layout and produces a corrected reticle layout to print a pattern that is as close to a target layout as possible. The corrections are iteratively determined using model-based simulations (e.g., optical model-based simulations and/or resist-based simulations). Simulations can be accomplished in any manner known in the art. In one embodiment, corrections of reticle layout portions are based on an edge placement error (EPE). EPE is the deviation of the simulated reticle layout portion (or actual reticle layout portion) from the corresponding target layout portion. EPE can be described in terms of axes (e.g., x-axis, y-axis and/or z-axis) and distance (e.g., 0.10 $\mu$m), or in any other appropriate manner to describe the offset of the simulated/actual structure as compared to the target layout. Alternatively, other metrics (e.g., edge slope deviation, a movement value, etc.) can be used to determine corrections of the reticle layout.

Corrections depend on certain parameters computed during the simulation. Some of these parameters are determined using expensive computations. For example, the determination of convolution and intensity involves very computationally intensive operations. In particular, to compute intensity at a specific point within the reticle layout, a contribution of each reticle layout segment positioned in the vicinity of this point need to be determined and multiplied by a transmission value, and then the multiplication results need to be added together. Because the number of reticle layout segments may be significant (e.g., there may be more than 100 segments), these computations can be very costly. The OPC module 100 reduces the amount of expensive computations required to perform the simulation by reusing simulation results of the expensive computations for matching geometrical patterns of the reticle layout.

For the illustrated embodiment, OPC module 100 includes a geometry identifier 102, a simulator 104, a cache 110, and a layout correction analyzer 116. Geometry identifier 102 is responsible for defining a reticle layout area for which simulation is to be performed. In one embodiment, geometry identifier 102 defines a reticle layout area by identifying, in the reticle layout, one or more points (referred to herein as control points) at which computations (e.g., intensity computations) are to be made and determining a geometrical layout pattern in the vicinity of the control points.

Simulator 104 is responsible for performing model-based analyses for each reticle layout area to determine the appropriate corrections for the particular reticle layout area using optical and/or resist models. In one embodiment, simulator 104 includes a matching geometry finder 106 and a simulation result calculator 108. Matching geometry finder 106 is responsible for facilitating a search of cache 110 for a geometrical layout pattern matching the pattern defined by geometry identifier 102. Cache 110 may be in the form of any data structure including, for example, a lookup table, a tree data structure, a sparse matrix data structure, or a hash table. Cache 110 stores data identifying geometrical layout patterns and associated simulation results. A simulation result may include intensity, EPE, or any other lithography and etch simulation result associated with a specific geometrical layout pattern. For each layout pattern, cache 110 may store more than one parameter. For example, cache 110 may store multiple intensity values for a layout pattern, with each intensity value corresponding to a specific control point in a group of control points. In another example, cache 110 may store both intensity and EPE for a layout pattern, etc.

If a matching layout pattern is not found in cache 110, simulator 104 performs the computations and stores the appropriate result(s) 112, together with data identifying the layout pattern, in cache 110 for future use. If cache 110 contains an entry for a matching layout pattern, a simulation result 114 associated with the matching layout pattern is retrieved from cache 110 and used by simulator 104 for further computations if the simulation result 114 is not the final result. For example, if the simulation result 114 consists of the intensity value, simulator 104 uses the intensity value to determine EPE. If the simulation result 114 is final (e.g., EPE), simulator 104 does not need to perform any computations for this reticle layout portion during the current simulation, i.e., the current simulation can be skipped for this reticle layout pattern.

Layout correction analyzer 116 is responsible for making the determined corrections for each reticle layout portion and comparing the corrected layout with the target layout. If the corrected mask layout is not sufficiently pre-compensated (i.e., it is unlikely to yield the desired image within a predetermined tolerance level), the process is repeated for the corrected reticle layout portion. The process may be performed multiple times, iteratively, until the predetermined tolerance level is reached.

Accordingly, OPC module 100 reduces costs associated with the simulation process by ensuring that the expensive computations are performed only once for matching geometrical layout patterns of the reticle layout. In addition, the reuse technique employed by OPC module 100 has no negative effect on OPC accuracy because this reuse technique does not eliminate iteratively performed simulations, thereby taking into account the matching geometry and various other factors that can contribute to computations performed during each iteration.

Figure 2:
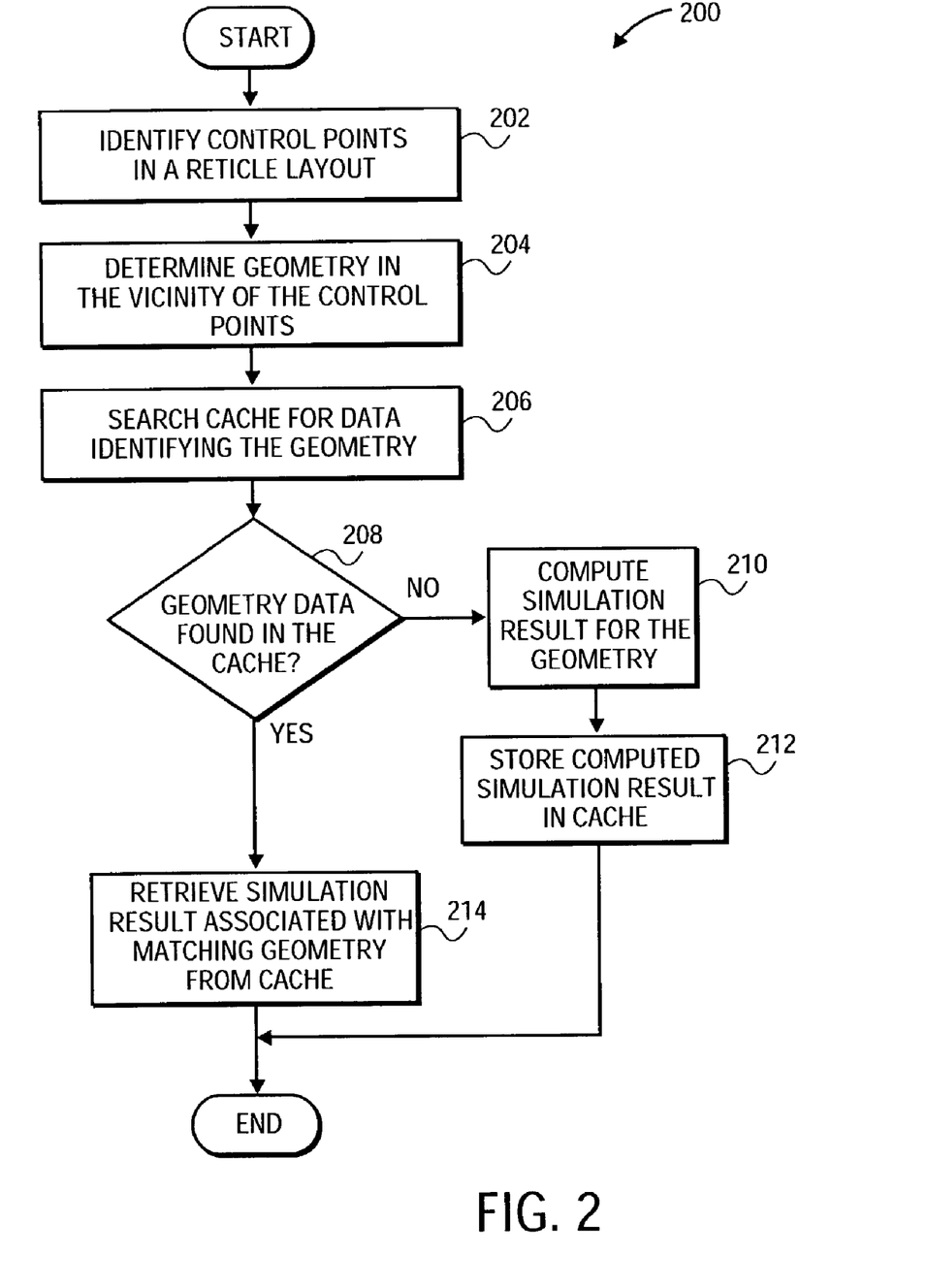
FIG. 2 is a flow diagram of one embodiment of a process for performing OPC on a reticle layout using previously calculated simulation results.

FIG. 2 is a flow diagram of one embodiment of a process 200 for performing OPC on a reticle layout using previously calculated simulation results. The process may be performed by processing logic that may comprise hardware (e.g., circuitry, dedicated logic, etc.), software (such as run on a general purpose computer system or a dedicated machine), or a combination of both.

Referring to FIG. 2, process 200 begins with processing logic identifying one or more control points within a reticle layout (processing block 202). As described above, a control point represents a point at which a computation will be performed. A control point may be selected by dividing the reticle layout into segments and selecting a point within each segment. A segment may be represented by a polygon or a sub-polygon (e.g., trapezoid, rectangle, triangle, edge, edge fragment, etc.). A control point may be a midpoint of the segment, an end point of the segment, a predetermined offset from the midpoint of the segment, or any other point within the segment. It should be noted that any technique known in the art can be used for selecting control points.

In one embodiment, a single control point is identified at processing block 202. In another embodiment, a group of control points is identified at processing block 202. The group of control points may include a predetermined number of control points (e.g., 12 or 24). The control points may be positioned in a line or in any other way (e.g., they may form a cross, a grid, etc.).

Figure 3:
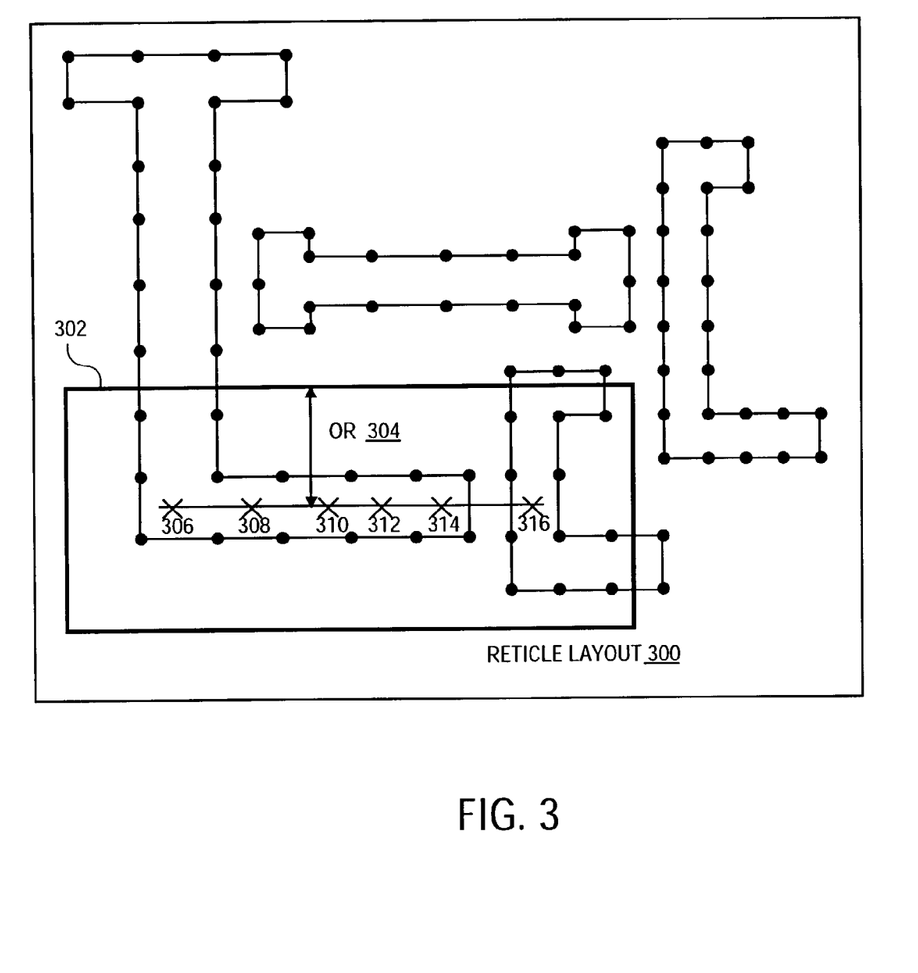
FIG. 3 illustrates a support region defined within a reticle layout, in accordance with an exemplary embodiment of the present invention.

At processing block 204, processing logic determines geometry (also referred to herein as a geometrical layout pattern) in the vicinity of the control points. In one embodiment, the geometry is determined by defining a support region around the control points using an optical radius and analyzing reticle layout segments within the support region. The optical radius may be specified by the user or defined programmatically. The support region may be of any shape (e.g., rectangular, square, circle, oval, etc.). FIG. 3 illustrates a support region 302 defined within a reticle layout 300 according to an exemplary embodiment of the present invention.

Referring to FIG. 3, the support region 302 is defined around a group of control points 306 through 316 that are positioned in a line. The size of the support region 302 depends on the optical radius 304. Edge fragments contained inside the support region 302 represent the geometry in the vicinity of the control points 306 through 316.

It should be noted that the geometry in the vicinity of control points can be determined in any other manner known in the art without loss of generality.

Returning to FIG. 2, at processing block 206, a cache (e.g., cache 110 of FIG. 1) is searched for geometry data identifying the geometry determined at processing block 208. In one embodiment, the geometry data includes a set of coordinates of reticle layout segments contained within the geometry. The coordinates define segment positions relative to the control point.

Next, processing logic determines whether the cache contains matching geometry data (decision box 208). If the determination is positive, processing logic retrieves a simulation result associated with the matching geometry from the cache (processing block 214). In one embodiment, in which a single control point is used, the simulation result includes an intensity value computed based on segments included in the geometry. In another embodiment, in which a group of control points is used, the simulation result may include a set of intensity values computed at corresponding control points from the group, a cumulative intensity value or other lithography and etch result value computed for the entire group of control points, or any combination of the above.

If the determination made at decision box 208 is negative, processing logic computes a simulation result (e.g., intensity, EPE, etc.) for the current geometry (processing block 210) and stores the simulation result, together with data identifying the geometry, in the cache for future reuse (processing block 212).

Figure 4:
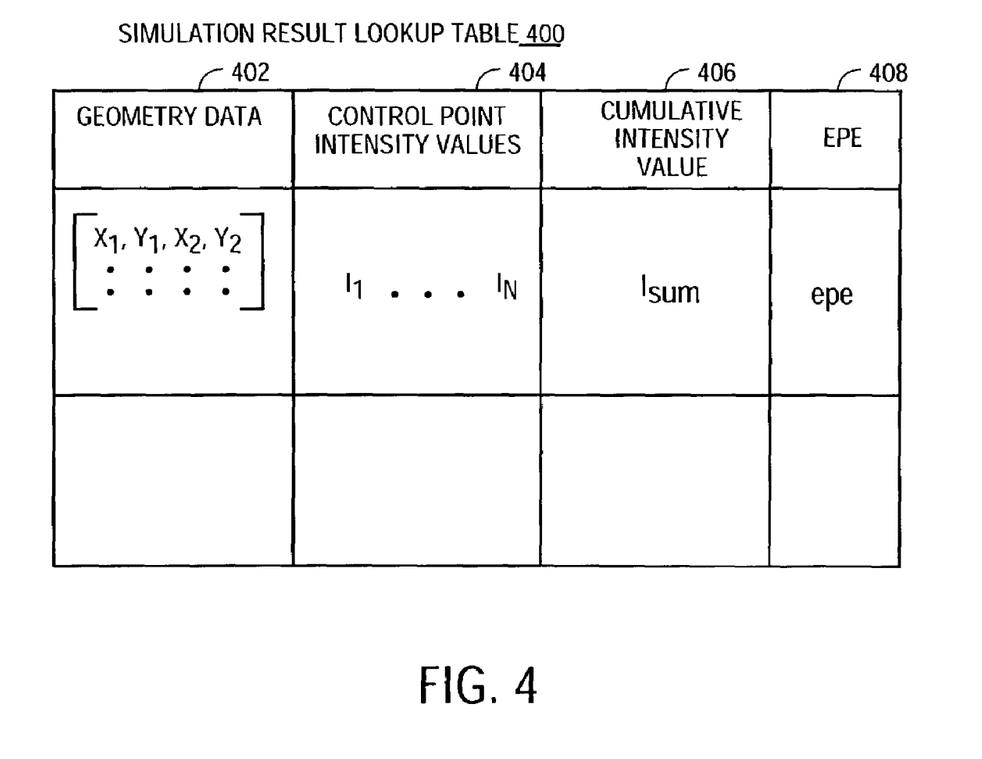
FIG. 4 illustrates an exemplary lookup table for storing simulation results, according to one embodiment of the present invention.

As described above, the cache of simulation results may be a lookup table, a tree data structure, a sparse matrix data structure, a hash table, or any other data structure for mapping one piece of data to another piece of data. FIG. 4 illustrates an exemplary lookup table 400 for storing simulation results, according to one embodiment of the present invention.

Referring to FIG. 4, lookup table 400 is used with groups of control points, rather than individual control points. Lookup table 400 includes column 402 storing data identifying various geometries and columns 404 through 408 storing simulation results corresponding to each specific geometry. Geometry data includes coordinates of each reticle layout segment contained in a support region that is defined around a specific group of control points. Column 404 stores sets of intensity values computed at corresponding control points. Column 406 stores cumulative intensity values computed for entire groups of control points. Column 408 stores EPEs determined for geometries stored in column 402. It should be noted that lookup table 400 may be limited to column 402 and any one or two columns from columns 404 through 408. Alternatively, lookup table 400 may store other simulation results in addition to, or instead of, the simulation results illustrated in FIG. 4. Such results may include edge slope deviations, rotation values, movement values, or any other lithography and etch simulation results.

The selection of parameters to be included in the lookup table 400 depends on the cost associated with the computation of this particular parameter, on how frequently this parameter is used during the OPC process, and some other factors.

In one embodiment, the size of the lookup table 400 is limited. In this embodiment, when it is necessary to add data to the lookup table 400 after it has already reached its size limit, any method known in the art can be used to select data in the lookup table 400 for removal. For example, the data may be selected for removal randomly (a Monte-Carlo method), based upon how recently each value has been used, based on the count indicating how many matches each element has had, etc.

Some target layouts may consist of patterns that are only partially similar. For such layouts, it may be useful to reuse partial simulation results. Partial simulation results correspond to partial geometries. For example, a partial simulation result may be a contribution of a specific partial geometry to intensity computed at a corresponding control point.

Figure 5:
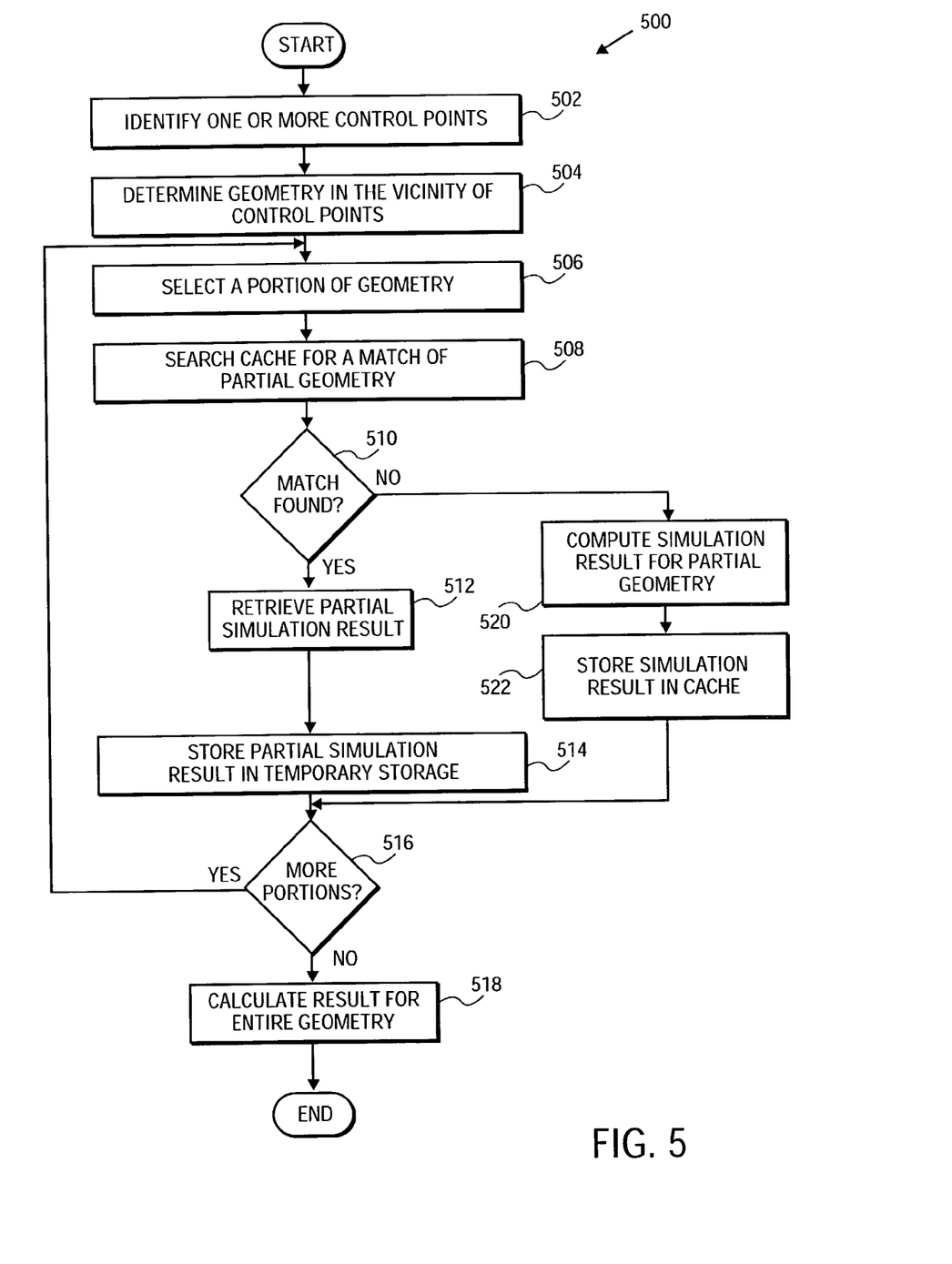
FIG. 5 is a flow diagram of one embodiment of a process for performing OPC on a reticle layout using previously calculated partial simulation results.

FIG. 5 is a flow diagram of one embodiment of a process 500 for performing OPC on a reticle layout using previously calculated partial simulation results. The process may be performed by processing logic that may comprise hardware (e.g., circuitry, dedicated logic, etc.), software (such as run on a general purpose computer system or a dedicated machine), or a combination of both.

Referring to FIG. 5, process 500 begins with processing logic identifying one or more control points at which a desired simulation result (e.g., intensity value) will be computed (processing block 502). Next, processing logic determines the geometry in the vicinity of the control points (processing block 504) and selects a portion of this geometry (processing block 506). The portion of the geometry may include one or more polygons and/or sub-polygons (e.g., trapezoids, rectangles, triangles, edges, edge fragments, etc.). In one embodiment, the portion of the geometry is selected after no match for the entire geometry was found in the cache. Alternatively, no search for a match of the entire geometry is performed.

At processing block 508, the cache is searched for a match of the partial geometry using data identifying the partial geometry. In one embodiment, the partial geometry data includes coordinates of each segment within the partial geometry. For example, if the partial geometry includes a single edge, the partial geometry data will consist of the coordinates of this edge.

At decision box 510, a determination is made as to whether a match is found. If the determination is positive, processing logic retrieves a partial simulation result (e.g., convolution) associated with the matching partial geometry data (processing block 512) and stores it in a temporary storage (processing block 514) until the results are determined for all portions of the geometry (decision box 516). Then, a cumulative simulation result (e.g., intensity) for the entire geometry is computed (processing block 518). In one embodiment, processing logic ensures, prior to reusing the partial simulation result, that the partial simulation result retrieved at processing block 512 can be used with the current partial geometry by verifying that the direction of the group of control points associated with the matching partial geometry is the same as the direction of the control points associated the current partial geometry and the segments of the matching partial geometry have the same relative location with respect to the control points as the segments of the current partial geometry.

Alternatively, if the determination made at decision box 510 is negative, i.e., no matching partial geometry is found in the cache, then processing logic computes the simulation result for the current partial geometry (processing block 520) and stores it in the cache (processing block 522).

Figure 6:
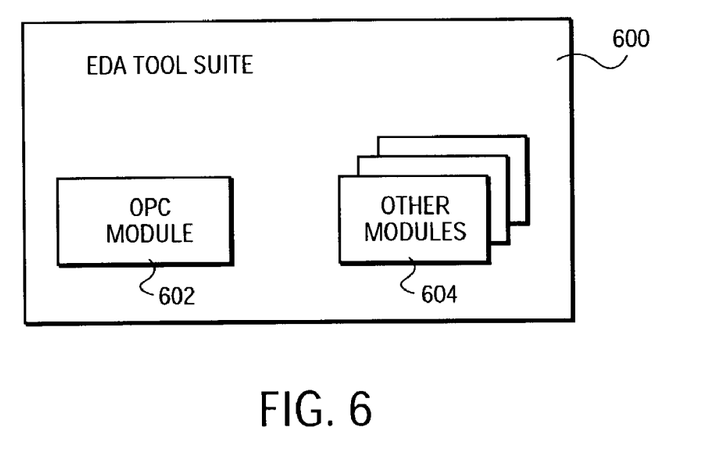
FIG. 6 illustrates an EDA tool incorporated with the simulation tool of the present invention, in accordance with one embodiment.

FIG. 6 illustrates an electronic design automation (EDA) tool incorporated with the OPC module of the present invention in accordance with one embodiment. As illustrated, EDA tool suite 600 includes OPC module 602 incorporated with the teachings of the present invention as described earlier with references to FIGS. 1–5. Additionally, EDA tool suite 600 includes other tool modules 604. Examples of these other tool modules 602 include but are not limited to synthesis module, layout verification module and so forth.

Figure 7:
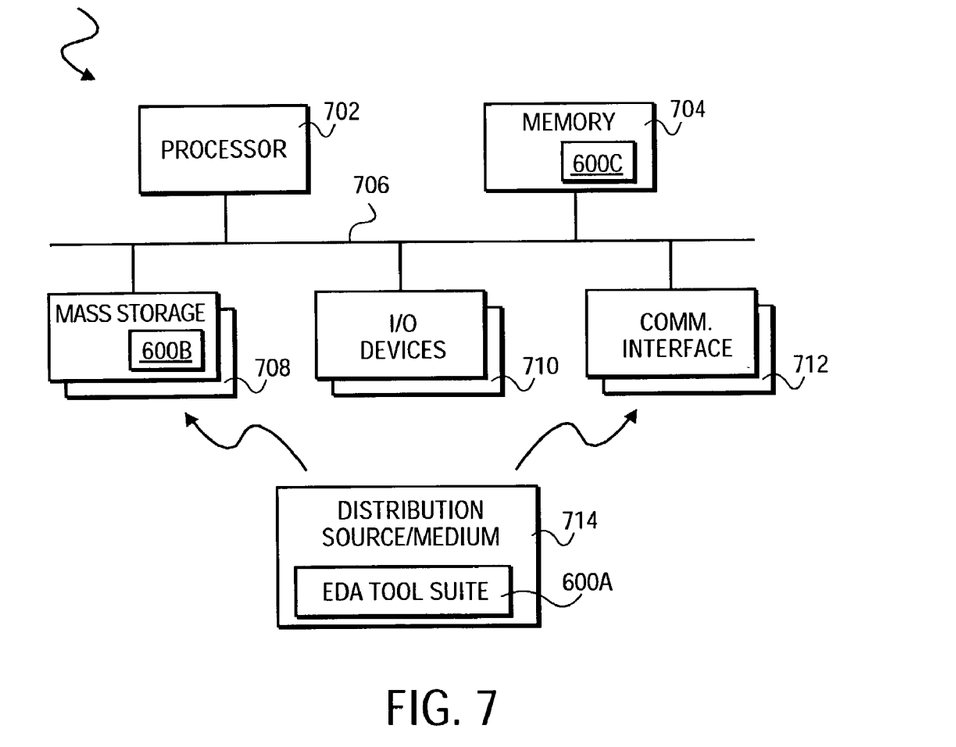
FIG. 7 illustrates one embodiment of a computer system suitable for use to practice the present invention.

FIG. 7 illustrates one embodiment of a computer system suitable for use to practice the present invention. As shown, computer system 700 includes processor 702 and memory 704 coupled to each other via system bus 706. Coupled to system bus 706 are non-volatile mass storage 708, such as hard disks, floppy disk, and so forth, input/output devices 710, such as keyboard, displays, and so forth, and communication interfaces 712, such as modem, LAN interfaces, and so forth. Each of these elements performs its conventional functions known in the art. In particular, system memory 704 and non-volatile mass storage 708 are employed to store a working copy and a permanent copy of the programming instructions implementing the above described teachings of the present invention. System memory 704 and non-volatile mass storage 706 may also be employed to store the IC designs. The permanent copy of the programming instructions to practice the present invention may be loaded into non-volatile mass storage 708 in the factory, or in the field, using distribution source/medium 714 and optionally, communication interfaces 712. Examples of distribution medium 714 include recordable medium such as tapes, CDROM, DVD, and so forth. In one embodiment, the programming instructions are part of a collection of programming instructions implementing EDA tool 600 of FIG. 6. The constitution of elements 702–714 are well known, and accordingly will not be further described.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method of preparing data in a layout for the creation of an integrated device layer, comprising:
   identifying one or more control points within a layout used in a simulation of a manufacturing process for the integrated device layer;
   determining a geometrical layout pattern corresponding to the one or more control points;
   searching a cache for previously computed simulation data associated with the geometric layout pattern; and
   retrieving the previously computed simulation data associated with the geometrical layout pattern from the cache for reuse when performing optical and process correction (OPC) on the one or more control points in the layout.

2. The method of claim 1 further comprising:
   determining that the cache does not store the simulation data associated with the geometrical layout pattern;
   calculating simulation data that is associated with the geometrical layout pattern; and
   storing the simulation data associated with the geometrical layout pattern in the cache for reuse during OPC of the layout with additional control points that have a corresponding geometrical layout pattern.

3. The method of claim 1, wherein the cache is any one of a lookup table, a tree data structure, a sparse matrix data structure and a hash table.

4. The method of claim 1, wherein the geometrical layout pattern is contained inside a support region that is defined around the one or more control points using an optical radius.

5. The method of claim 4, wherein the simulation data is at least one of an intensity value, an edge placement error, a rotation value, and an edge slope deviation value.

6. The method of claim 1, wherein the geometrical layout pattern is a portion of geometry contained inside a support region that is defined around the one or more control points using an optical radius.

7. The method of claim 6, wherein the portion of geometry is at least one of a polygon and a sub-polygon.

8. The method of claim 7, wherein the sub-polygon is any one of an edge, a trapezoid, a rectangle, and a triangle.

9. The method of claim 6, wherein the simulation data is a convolution value associated with the portion of geometry.

10. The method of claim 1, wherein the simulation data associated with the geometrical layout pattern includes a set of coordinates of portions of the geometrical layout pattern, the set of coordinates identifying positions of the portions relative to the one or more control points.

11. The method of claim 1, wherein the one or more control points represent a group of points; and
    the simulation data includes a set of computation values, each of the set of computation values corresponding to a specific point within the group of control points.

12. The method of claim 1, wherein:
    the one or more control points represent a group of control points; and
    the simulation data includes a cumulative computation value corresponding to the entire group of control points.

13. A machine-readable medium having stored thereon sequences of instructions that, when executed, cause one or more electronic systems to perform the method of claim 1.

14. A computer data signal transmitted in a data communications medium shared among a plurality of network devices that encodes a sequence of instructions that, when executed, cause one or more electronic systems to perform the method of claim 1.

15. A method of preparing data that describes an integrated device layer, comprising: transmitting data that describes an integrated device layer to a computer that performs the method of claim 1; and receiving data that describes the integrated device layer from the computer.

* * * * *